United States Patent
Casey et al.

(10) Patent No.: US 6,625,684 B1
(45) Date of Patent: Sep. 23, 2003

(54) APPLICATION SPECIFIC INTEGRATED CIRCUIT WITH DUAL-MODE SYSTEM FOR EXTERNALLY ACCESSIBLE DATA BUSES AND VISIBILITY BUSES

(75) Inventors: Fergus Casey, Dublin (IE); Vincent Gavin, Galway (IE); Gareth E Allwright, St Albans (GB); Kam Choi, Tring (GB); Christopher Hay, South Harrow (GB); Kevin Loughran, Castleblayney (IE); Patrick Gibson, London (GB)

(73) Assignee: 3Com Corporation, Santa Clara, CA (US)

( * ) Notice: Subject to any disclaimer, the term of this patent is extended or adjusted under 35 U.S.C. 154(b) by 515 days.

(21) Appl. No.: 09/668,301

(22) Filed: Sep. 25, 2000

(30) Foreign Application Priority Data

Jul. 8, 2000 (GB) .............................................. 0016753

(51) Int. Cl.[7] .......................... G06F 13/00; G06F 11/00
(52) U.S. Cl. ........................ 710/316; 710/100; 714/100
(58) Field of Search ................................ 710/100, 316, 710/317; 714/100; 326/16; 370/241, 364; 712/38

(56) References Cited

U.S. PATENT DOCUMENTS

| 5,331,571 | A |   | 7/1994  | Aronoff et al. |
| 5,448,576 | A |   | 9/1995  | Russell |
| 5,465,056 | A | * | 11/1995 | Hsieh et al. ................... 326/41 |
| 5,625,780 | A | * | 4/1997  | Hsieh et al. ................. 710/316 |
| 5,682,391 | A |   | 10/1997 | Narayanan |
| 5,826,047 | A | * | 10/1998 | Dunn et al. .................. 710/305 |
| 5,918,064 | A | * | 6/1999  | Miller et al. ................... 712/38 |

FOREIGN PATENT DOCUMENTS

EP 0333241 9/1989

* cited by examiner

Primary Examiner—Xuan M. Thai
(74) Attorney, Agent, or Firm—Nixon & Vanderhye P.C.

(57) ABSTRACT

An application specific integrated circuit includes a multiplicity of operational blocks each of which includes at least one respective data bus and at least one respective visibility bus and a respective addressable multiplexer for selecting between those buses to provide an output on a to respective block bus. An interface block includes a first addressable multiplexer for selecting output data from a selected one of the blocks and providing an output; a register coupled to the output of the first addressable multiplexer; and a second addressable multiplexer for selecting between data provided by the output of the first addressable multiplexer and data in the register. Different portions of externally supplied address words are applied to the first addressable multiplexer and the respective addressable multiplexer, and a decoder is responsive to the address words for controlling the second addressable multiplexer. The arrangement provides a common multiplexing system for data buses and visibility buses.

2 Claims, 1 Drawing Sheet

APPLICATION SPECIFIC INTEGRATED CIRCUIT WITH DUAL-MODE SYSTEM FOR EXTERNALLY ACCESSIBLE DATA BUSES AND VISIBILITY BUSES

FIELD OF THE INVENTION

This invention relates to application specific integrated circuits particularly though not necessarily exclusively intended to constitute the data handling and switching requirements of a network device intended for use in a packet-based communication system or as a modular part of such a device. The invention more particularly relates generally to the reading and to writing of data in to and out of registers within the application specific integrated circuit and the monitoring of data available on visibility buses within the circuit.

BACKGROUND TO THE INVENTION

Application specific integrated circuits, both in the specific context indicated above and more generally, commonly contain a multiplicity of registers for the storage of data, which may be message data or control data. It is also common place to provide an addressable multiplexing and demultiplexing system which is addressable by means of, for example, a central processing unit so that data may be written in to or read out of such registers. Broadly, each operational 'block' within the ASIC may have data buses which are addressable by part of an address supplied by a CPU and the data buses each common to a particular operating block may be selectable by a further multiplexing or demultiplexing stage by other parts of an address supplied by a CPU so that a selected data bus may supply data to or receive data from a bi-directional buffer for the ASIC. Address data may be supplied to appropriate externally accessible pins of the ASIC and the bidirectional buffer may also be associated with a set of pins by means of which data may be written in to or read out of the buffer as the case may be.

It is also commonplace for ASICs to include other data buses known as 'visibility' buses which are provided for each operational block and which provide data denoting the operational state of appropriate parts of the block. Such visibility buses are intended only for monitoring preferably in real time, and provide normally multi-bit data outputs denoting, for example, the state of a respective register in a state machine within the respective block.

A broad difference between data buses and visibility buses is that data on the former should be temporarily stored (in a register) until a reading cycle is completed, whereas data on the latter needs to be viewed in real time without storage or clocking.

It is usual for visibility buses to be brought out, with the aid of a multiplexing system if appropriate, to dedicated pins of the ASIC.

It is the general object of the invention to reduce the need for visibility buses other than within operational blocks of the ASIC and more particularly to render unnecessary the provision of externally accessible pins coupled to such visibility buses.

SUMMARY OF THE INVENTION

The present invention is based on the use of a common multiplexing system for read out of data both on data buses and visibility buses. In a preferred form, the invention employs a common multiplex system for data and visibility buses within each block and with an interface blocks by means of which data may be read out either from the data buses or validity buses to a common buffer which is externally accessible, for example by an external CPU.

Other objects and features of the invention will be apparent from the following description and the accompanying drawing.

BRIEF DESCRIPTION OF THE DRAWING

The single

DESCRIPTION OF A PREFERRED EXAMPLE

Figure 1:
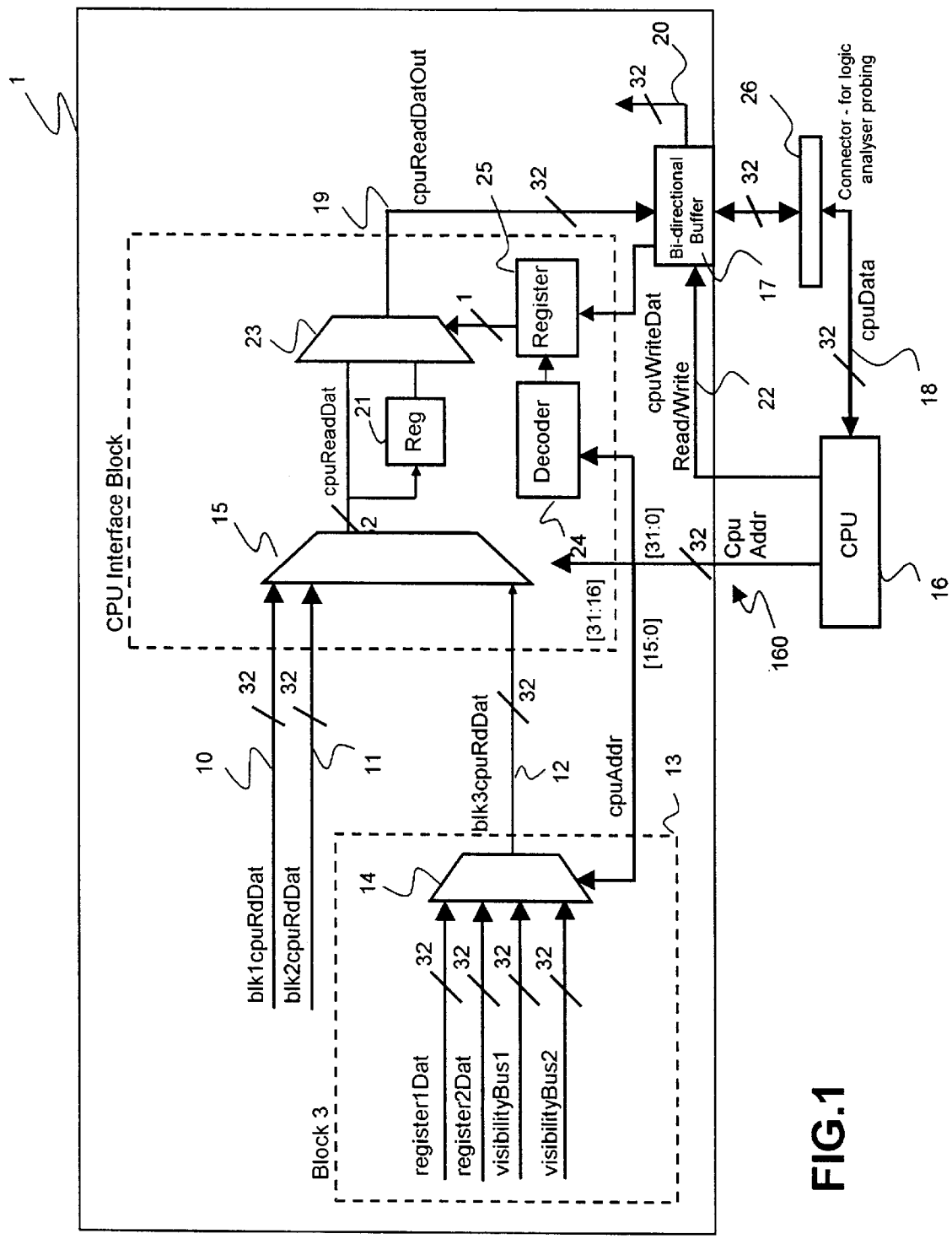
FIG. 1 is a schematic diagram illustrating in simplified form an application specific integrated circuit embodying the invention and operating in conjunction with an external CPU.

The single FIG. 1 illustrates in a simplified manner the relevant parts of an application specific integrated circuit which embodies the invention. For convenience, the commonplace parts of the ASIC will be described first. The ASIC, in a manner similar to a wide variety of ASICs, has extending from each of a multiplicity of operational blocks a respective data bus such as the data buses 10, 11 and 12. In this example it is assumed that there is a single 'read' data bus for each 'block' though this is not an absolute limitation on the invention or ASICs generally. For the sake of simplicity only a single 'block' 13 has been shown. The data output on the respective bus 12 is denoted 'blk3cpuRdDat', indicating that this is data read from block 3 and intended for an (external) central processing unit. Similarly, the read data from other blocks and data buses such as 10 and 11 is denoted blk1cpuRdDat and blk2cpuRdDat respectively.

Normally each of the buses 10, 11 and 12 and others that there may be are multiple-bit, for example 8, 16 or 32-bit. In this example it is assumed that the data buses are 32 bits wide and so the various multiplexers and buffer to be described will be of similar width.

The data block 13 includes in this example two data buses which extend from respective registers and which can provide data which may be read by an external CPU. The data on these two buses is denoted register1Dat and register2Dat respectively. These data buses are coupled to an input of a multiplexer 14 which can be addressed by, typically, the least significant bits of an address word cpuAddr from an external CPU 16 providing address words to address pins (shown schematically at 160) of the ASIC. A further multiplexing stage is represented by the multiplexer 15, which is addressed by the more significant bits of the 'cpuAddr' address word to select from one of the data buses data to constitute the cpuReadDat data. Such data will be provided by the output of multiplexer 15 to a buffer 17 coupled to externally accessible pins (not explicitly shown) so as to provide data to the CPU by way of a 'cpuData' bus 18.

Omitted from the sake of simplicity in the drawing is a demultiplexing system by means of which data provided by the CPU on bus 18 to the buffer 17, which for this purpose will be a bi-directional buffer, is provided on an internal data bus 20 and by way of a de-multiplexing system (not shown), controlled by the CPU addressing words, so that the data is directed to the appropriate data register within an ASIC block.

An ASIC as thus far described is in a well known form. Where the buffer 17 is bidirectional as is preferred, its operational state, namely either read or write, is controlled by a single bit line 22 conveying a read/write command to the buffer 17 from the external CPU 16.

As has been previously mentioned hitherto, it is commonplace to provide within each operational block of the ASIC at least one and preferably rather more than one visibility bus. The visibility buses in block 13 are represented as 'visibilityBus1' and 'visibilityBus2'. The other blocks in the ASIC will have similar visibility buses within them.

The main purpose of a visibility bus is to provide a feature which is used during debugging or testing of the design of an application specific integrated circuit. The designers of each block within the ASIC may select buried key signals for real time external visibility, either for the purpose of debugging or to assist with the monitoring of any functional vectors (digital test signals) If any operational failure or fault is known or suspected, monitoring of visibility buses may assist the rectification of the fault or provide an indication of the manner in which a design may have to be changed.

However, the provision of visibility buses external to a block requires additional routing and normally dedicated visibility pins of the ASIC. The main object of the invention is to minimise the logic or data paths required not withstanding the provision of visibility buses in substantial numbers.

As is shown in FIG. 1, the visibility buses within block 13 are connected to the same multiplexer (14) as the register data buses of that block. The same provision is made in the other blocks which have visibility buses within the ASIC. The bits of the CPU address signal now need to be sufficient to select among the internal register data buses and the visibility buses of block 13 by means of the multiplexer 14. The output of the multiplexer 14 will therefore represent data from any of the buses connected to it, that is to say not only the data buses but also the visibility buses. Which of the data buses 10, 11 or 12 which extend to the interface block and particularly the multiplexer 15 is selected for output from the multiplexer 15 again will depend on the relevant bits of the CPU address signal.

In this embodiment of the invention the output bus from multiplexer 15 is connected to one input of a multiplexer 23 of which the other selectable input is connected to a register 21 also coupled to the output of multiplexer 15.

The CPU address data is connected not only to multiplexers such as multiplexers 14 and 15 but also to a decoder 24 which determines whether the address selected is that of a visibility bus (such as visibilityBus1) or a register data bus. In the case of the former, decoder 24 sets a single bit register 25 to control multiplexer 23 to select data coming directly from the output of multiplexer in real time. If however a data read is required the read/write signal on line 22 causes bidirectional buffer 17 to re-set register 25 to cause the multiplexer 23 to select data from register 21. Thus the read-out of data buses, but not visibility buses, is determined by the read/write cycle of the CPU.

Data available at the pins coupled to bidirectional buffer 17 may be monitored by way of a connector 26.

What is claimed is:

1. An application specific integrated circuit including:

a multiplicity of operational blocks each of which includes at least one respective data bus and at least one respective visibility bus and a respective addressable multiplexer for selecting between those buses to provide an output on a respective block bus, an interface block including a first addressable multiplexer for selecting output data from a selected one of the blocks and providing an output, a register coupled to the output of said first addressable multiplexer, and a second addressable multiplexer for selecting between data provided by the output of said first addressable multiplexer and data in said register, said second addressable multiplexer having an output, means for receiving externally supplied address words and applying different portions thereof to said first addressable multiplexer and said respective addressable multiplexer, and a decoder responsive to said address words for controlling said second addressable multiplexer.

2. A circuit according to claim 1 and further comprising a bidirectional buffer for receiving data signals from said second addressable multiplexer and read/write control signals, and a control register for controlling said second addressable multiplexer, said control register being coupled for control by said decoder and said bidirectional buffer.

* * * * *